United States Patent
Zeng et al.

(10) Patent No.: US 11,107,875 B2
(45) Date of Patent: Aug. 31, 2021

(54) DISPLAY PANEL, FABRICATION AND DRIVING METHOD THEREOF, AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Yanbo Zeng, Beijing (CN); Qiang Huang, Beijing (CN); Yaqin Xia, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/639,457

(22) PCT Filed: Jul. 16, 2019

(86) PCT No.: PCT/CN2019/096222
§ 371 (c)(1),
(2) Date: Feb. 14, 2020

(87) PCT Pub. No.: WO2020/063049
PCT Pub. Date: Apr. 2, 2020

(65) Prior Publication Data
US 2021/0134921 A1 May 6, 2021

(30) Foreign Application Priority Data
Sep. 30, 2018 (CN) .......................... 201811156164.8

(51) Int. Cl.
*H01L 27/32* (2006.01)
*H01L 51/56* (2006.01)
*G09G 3/3208* (2016.01)

(52) U.S. Cl.
CPC ....... *H01L 27/3276* (2013.01); *G09G 3/3208* (2013.01); *H01L 51/56* (2013.01); *H01L 2227/323* (2013.01)

(58) Field of Classification Search
CPC ... H01L 27/3276; H01L 51/56; G09G 3/3208; G09G 3/2092
See application file for complete search history.

(56) References Cited

U.S. PATENT DOCUMENTS 6,741,297 B2  5/2004  Moon et al.
9,236,202 B2  1/2016  Mohapatra et al.
(Continued)

FOREIGN PATENT DOCUMENTS

CN  1341869    3/2002
CN  104603730  5/2015
(Continued)

OTHER PUBLICATIONS

International Search Report and Written Opinion dated Oct. 16, 2019 for PCT Patent Application No. PCT/CN2019/096222.
(Continued)

*Primary Examiner* — Sardis F Azongha
(74) *Attorney, Agent, or Firm* — Thomas | Horstemeyer, LLP

(57) ABSTRACT

The present disclosure proposes a display panel, a fabrication method, a driving method thereof, and a display device. The display panel comprises a display area comprising a plurality of OLEDs; a peripheral area located in the periphery of the display area and having a driving circuit configured to provide driving signals to the plurality of OLEDs; a packaging material disposed between the display area and the peripheral area; a first signal line passing through the packaging material to provide a first signal from the driving circuit to the plurality of OLEDs; a second signal line
(Continued)

passing through the packaging material to provide a second signal from the driving circuit to the plurality of OLEDs; and a sacrificial line being configured adjacent to the first signal line and the second signal line, where the sacrificial line is connected to a voltage supply element.

20 Claims, 4 Drawing Sheets

(56) References Cited

U.S. PATENT DOCUMENTS

| | | | |
|---|---|---|---|
| 10,048,814 B2 | 8/2018 | Mohapatra et al. | |
| 10,067,586 B2 | 9/2018 | Kim et al. | |
| 10,741,630 B2* | 8/2020 | Seo | B23K 26/20 |
| 2002/0038868 A1 | 4/2002 | Wada et al. | |
| 2002/0054004 A1 | 5/2002 | Moon et al. | |
| 2014/0069785 A1 | 3/2014 | Mohapatra et al. | |
| 2016/0085342 A1 | 3/2016 | Mohapatra et al. | |
| 2017/0185195 A1 | 6/2017 | Kim et al. | |
| 2017/0287386 A1* | 10/2017 | Oh | G09G 3/2092 |

FOREIGN PATENT DOCUMENTS

| | | |
|---|---|---|
| CN | 105810695 | 7/2016 |
| CN | 107817638 | 3/2018 |
| CN | 109360842 | 2/2019 |
| CN | 109686775 | 4/2019 |
| CN | 109755280 | 5/2019 |
| JP | 2009084116 | 4/2009 |
| KR | 20170080225 | 7/2017 |
| WO | 2014039914 | 3/2014 |

OTHER PUBLICATIONS

1st Office Action dated Mar. 27, 2020 for Chinese Patent Application No. 201811156164.8.
Notice of Allowance dated Jul. 3, 2020 for Chinese Patent Application No. 201811156164.8.

* cited by examiner

DISPLAY PANEL, FABRICATION AND DRIVING METHOD THEREOF, AND DISPLAY DEVICE

CROSS REFERENCE TO RELATED APPLICATIONS

The present application is based upon PCT Patent Application No. PCT/CN2019/096222, filed on Jul. 16, 2019, which claims the benefit of and priority to Chinese Patent Application No. 201811156164.8, titled "DISPLAY PANEL, FABRICATION AND DRIVING METHOD THEREOF, AND DISPLAY DEVICE", filed on Sep. 30, 2018, where the entire contents thereof are incorporated by reference in their entireties herein.

TECHNICAL FIELD

The present disclosure relates to the technical field of display devices and, in particular, relates to a display panel, a fabrication method, a driving method thereof, and a display device.

BACKGROUND

Organic Light Emitting Diode (OLED), a current-type light emitting device, is widely used in high-performance display fields because it has advantages of self-emission, fast response, wide viewing angle, and can be fabricated on flexible substrates. The basic structure of an OLED device may include a cathode, an anode, and an organic light emitting material layer therebetween. Its working principle includes, under the excitation of an electric field, electrons and holes are injected into the organic light-emitting material layer for recombination, thereby achieving a self-luminous function.

It should be noted that the information disclosed in the Background section above is only used to enhance the understanding of the background of the present disclosure, and therefore may include information that does not constitute the prior art known to those skilled in the art.

SUMMARY

The present disclosure provides a display panel, a fabrication method, a driving method thereof, and a display device.

In an aspect of the present disclosure, a display panel includes a substrate, including a display area and a non-display area located outside the display area; a plurality of organic light emitting diodes located in the display area; a driving circuit located in the peripheral area, the driving circuit being configured to provide driving signals to the plurality of organic light emitting diodes; a packaging material disposed between the display area and the peripheral area; a first signal line configured to electrically connect the driving circuit and the plurality of organic light emitting diodes; a second signal line configured to electrically connect the driving circuit and the plurality of organic light emitting diodes, where an orthographic projection of the first signal line on the substrate and an orthographic projection of the second signal line on the substrate are at least partly not overlapped; and a sacrificial line disposed adjacent to the first signal line and the second signal line, where the sacrificial line is electrically connected to a voltage supply element.

According to an embodiment, the voltage supply element is disposed in the driving circuit.

According to an embodiment, a distance between an orthographic projection of the sacrificial line on a plane where the substrate is located and the orthographic projection of the first signal line on the plane where the substrate is located is smaller than a distance between the orthographic projection of the second signal line on the plane where the substrate is located and the orthographic projection of the first signal line on the plane where the substrate of the display panel is located.

According to an embodiment, the sacrificial line and the second signal line are located on a same side of the first signal line.

According to an embodiment, the sacrificial line extends from the peripheral area into the packaging material.

According to an embodiment, the sacrificial line does not extend into the display area.

According to an embodiment, the sacrificial line is disposed on a same layer as the first signal line and/or the second signal line.

In an aspect of the present disclosure, a display device includes a display panel and a frame according to the aforementioned aspect.

In an aspect of the present disclosure, a method for driving a display panel is used to drive the display panel according to the aforementioned aspect, the method including:

providing a first signal and a second signal to the first signal line and the second signal line respectively through the driving circuit, a level of the first signal being lower than a level of the second signal; and providing a third signal to the sacrificial line through the voltage supply element, a level of the third signal being always higher than the level of the first signal and the level of the second signal.

It should be understood that the above general description and the following detailed description are merely exemplary and explanatory, and should not limit the present disclosure.

This section provides an overview of various implementations or examples of the technology described in this disclosure, and is not a comprehensive disclosure of the full scope or all features of the disclosed technology.

BRIEF DESCRIPTION OF THE DRAWINGS

The drawings herein, which are incorporated in and constitute a part of this specification, illustrate embodiments consistent with the present disclosure, and together with the description serve to explain the principles of the present disclosure. Understandably, the drawings in the following description are just some embodiments of the present disclosure. For those of ordinary skill in the art, other drawings can be derived according to these drawings without creative efforts.

DETAILED DESCRIPTION

Figure 1A:
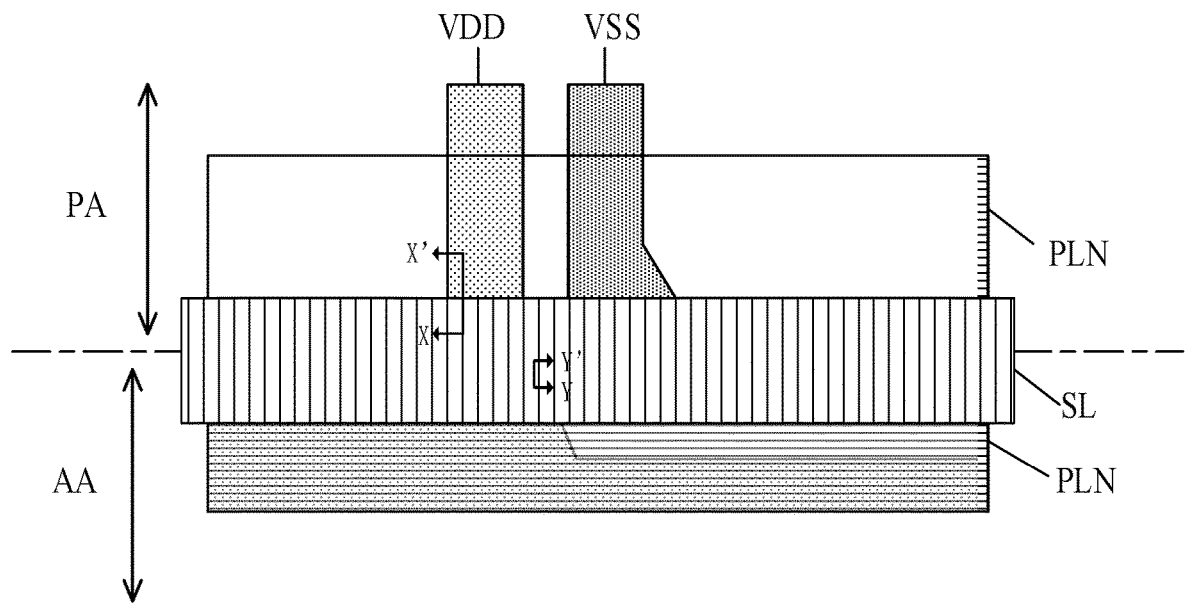
FIG. 1A to FIG. 1C are schematic views illustrating a display panel according to a comparative example of the present disclosure.

Exemplary embodiments will now be described more fully with reference to the accompanying drawings. However, the exemplary embodiments can be implemented in various forms and should not be construed as limited to the examples set forth herein. Rather, the embodiments are provided so that this disclosure will be more comprehensive and complete, and will fully convey the concept of the exemplary embodiments to those skilled in the art. The described features, structures, or characteristics may be combined in any suitable manner in one or more embodiments. In the following description, numerous specific details are provided to give a full understanding of the embodiments of the present disclosure. However, those skilled in the art will realize that the technical solutions of the present disclosure may be practiced without omitting one or more of the specific details, or other methods, components, devices, steps, etc. may be adopted. In other cases, well-known technical solutions are not shown or described in detail to avoid obscuring aspects of the present disclosure.

In addition, the drawings are merely schematic illustrations of the present disclosure and are not necessarily drawn to scale. The thickness and shape of each layer in the drawings do not reflect the true proportions, and are merely for convenience in explaining the content of the present disclosure. The same reference numerals in the drawings represent the same or similar parts, and thus repeated descriptions thereof will be omitted.

Figure 1B:
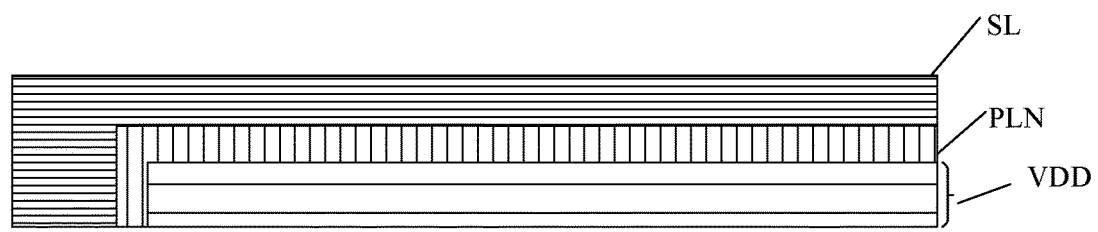
Figure 1C:
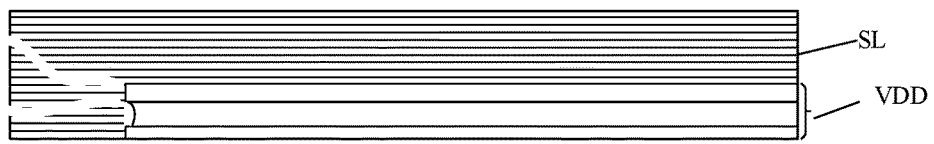
Figure 2:
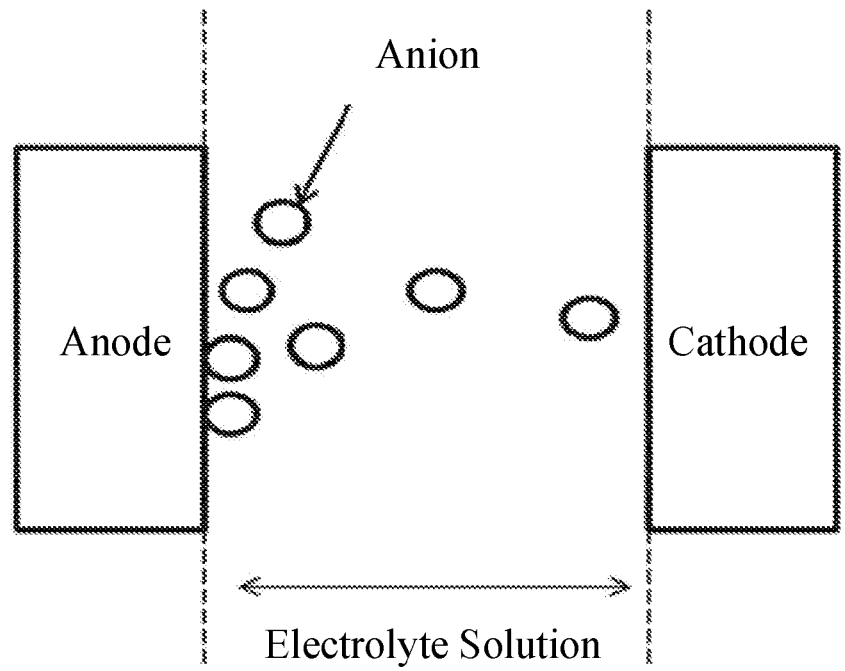
FIG. 2 is a schematic diagram of the principle of electrochemical corrosion according to a comparative example of the present disclosure.

FIG. 1A to FIG. 1C are schematic diagrams showing a sealing structure of a display panel according to a comparative example of the present disclosure. FIG. 2 is a schematic diagram of the principle of electrochemical corrosion according to a comparative example of the present disclosure.

Referring to FIG. 1A to FIG. 2, a display panel according to a comparative example of the present disclosure may include a display area AA and a peripheral area PA located in the periphery of the display area. A plurality of OLEDs are provided in the display area AA, and a driving circuit is provided in the peripheral area PA for providing driving signals to the plurality of OLEDs in the display area AA, so that the OLEDs emit light.

As shown in FIG. 1A, a packaging material SL is disposed between the peripheral area PA and the display area AA so that the display area AA is sealed. FIG. 1A schematically illustrates a planarization layer PLN in a display panel, where a slotted region is included between the planarization layers PLN. FIG. 1B shows a schematic cross-sectional view of an unslotted area corresponding to the planarization layer along line XX' in FIG. 1A. FIG. 1C shows a cross-sectional view of a slotted area corresponding to the planarization layer along line YY' in FIG. 1A.

As shown in FIG. 1B, the packaging material SL may cover an upper surface of the planarization layer PLN. As shown in FIG. 1C, the packaging material SL may also cover the slotted area of the planarization layer PLN, that is, an area where a high-level power supply line VDD is not covered by the planarization layer PLN. In the case where the sealability of the display area AA is satisfied, the setting range of the packaging material can be appropriately adjusted according to actual needs, and this disclosure does not specifically limit this. In an embodiment of the present disclosure, the packaging material SL may include an organic material, an inorganic material, or a laminated structure of an organic material and an inorganic material, which is not specifically limited in the present disclosure. It should be understood that FIG. 1A to FIG. 1C only schematically show the planarization layer, the packaging material, the high-level power supply line VDD, and a low-level power supply line VSS, and should not be construed as limiting their specific shape, structure, and/or layout.

In order to provide driving signals to the display area AA, the display panel also includes a plurality of signal lines (traces/wirings) that pass through the packaging material SL and are connected to the driving circuit and the OLED, respectively. In the display panel, in order to protect these signal lines, an organic planarization layer PLN may be generally provided to cover these signal lines and a flat surface is provided for forming a subsequent structure. However, some signal lines, such as the high-level power supply lines VDD and the low-level power supply lines VSS, may have portions disposed in the slotted area of the planarization layer PLN, such that these portions are not protected by the planarization layer PLN. As shown in FIG. 1B and FIG. 1C, the high-level power supply line VDD includes three layers of stacked structures of Ti, Al, and Ti, respectively. In this case, introduction of a gap may occur in the edge of the signal line due to corrosion of one or more layers of the signal line. In this case, when the encapsulation material SL is disposed at the position where the gap occurs, a large area stress may be generated in the gap area, which causes the encapsulation material SL at that position to crack and causes external moisture and oxygen to enter the gap, as shown in FIG. 1C.

If moisture and oxygen come into contact with the signal lines, electrochemical corrosion may occur during the driving process of the display panel. Specifically, as shown in FIG. 2, the two signal lines (for example, the VDD trace and the VSS trace) are equivalent to the positive electrode and the negative electrode respectively due to different levels during the driving process. Moisture and oxygen entering the interior of the packaging material SL may be mixed with inorganic ions or organic ions to form electrolyte solution. In this case, an anion in the electrolyte solution oxidizes a metal electrode and causes the metal to lose electrons and be corroded. As shown in FIG. 2, electrochemical corrosion occurs more in the anode due to the presence of an external electric field that accelerates the movement of ions, thereby accelerating the rate of electrochemical corrosion, and the anode is more likely to attract anions. From defective products of the statistical reliability test, it is also found that most of the electrochemical corrosion occurs near the VDD trace, the VDD voltage gives a positive value, and the VSS voltage gives a negative value. Therefore, when such electrochemical corrosion occurs, the packaging material SL and the VDD trace at the VDD trace may be stripped, thereby forming a channel for moisture and oxygen to further enter the display area AA of the display panel, which causes the OLED to be damaged by the effects of moisture and oxygen.

The principle of degradation of the display panel of the present disclosure has been described in detail above in conjunction with the comparative example of the present disclosure, and the present disclosure will be described in more detail with reference to the accompanying drawings of the embodiments of the present disclosure.

Figure 3:
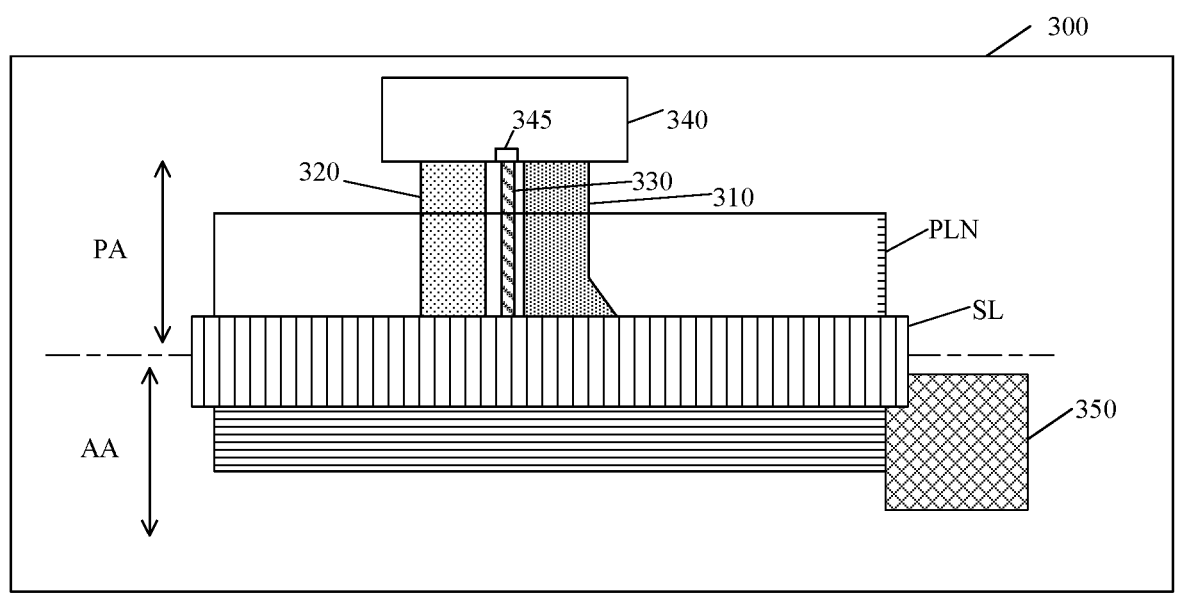
FIG. 3 is a schematic diagram of a display panel according to an exemplary embodiment of the present disclosure.

FIG. 3 is a schematic diagram of a display panel according to an exemplary embodiment of the present disclosure. Referring to FIG. 3, the display panel according to this embodiment includes: a substrate 300 including a display area AA and a non-display area PA located outside the display area; a plurality of organic light emitting diodes 350 located in the display area AA; a driving circuit 340 located in the non-display area PA, the driving circuit 340 being configured to provide driving signals to the plurality of organic light emitting diodes 350; a packaging material SL disposed between the display area and the non-display area PA; a first signal line 310 configured to electrically connect the driving circuit 340 and the plurality of organic light emitting diodes 350; a second signal line 320 configured to electrically connect the driving circuit 340 and the plurality of organic light emitting diodes 350, where orthographic projections of the first signal line 310 and the second signal line 340 on the substrate are at least partly not overlapped (or, in other words, are partly non-overlapping); and a sacrificial line 330 disposed adjacent to the first signal line 310 and the second signal line 320, the sacrificial line 330 being electrically connected a voltage supply element 345.

It should be understood that the OLED is schematically shown in FIG. 3 with a block 350; however, this block is only used to explain the OLED schematically, and should not be construed as limiting the shape, structure, and/or location of the OLED.

The voltage supply element 345 may supply a signal having a predetermined level to the sacrificial line 330. The voltage supply element 345 may be a part of the driving circuit 340 and may be integrated in the driving circuit 340. However, the present disclosure is not limited thereto, and the voltage supply element 345 may be another power supply circuit configured to provide a predetermined level to the sacrificial line 330.

In another embodiment, the driving circuit 340 may be a part of a driving IC of a display panel or connected to the driving IC. In other words, the first signal line 310, the second signal line 320, and the sacrificial line 330 can all be directly or indirectly connected to the driving IC of the display panel to obtain a signal having a corresponding level from the driving IC. In the present disclosure, the driving IC may also be denoted by reference numeral 340 in FIG. 3, however, the present disclosure is not limited thereto.

According to this embodiment, when the display panel is driven, a level of the first signal is lower than a level of the second signal, and a level of the sacrificial line 330 is always higher than the level of the first signal and the level of the second signal. In this case, since the level of the sacrificial line 330 is always higher than the level of the second signal, the level of the sacrificial line 330 is higher than the level of the second signal line 320. Since the level of the sacrificial line 330 is higher than the level of the second signal line 320, as shown in FIG. 2, the sacrificial line 330 is more likely to attract anions, so that the sacrificial line 330 is preferentially corroded, thereby preventing the second signal line 320 from being corroded because it has a higher level than the first signal line 310. Therefore, according to the present disclosure, corrosion of the second signal line 320 can be prevented, thereby avoiding the channel of moisture and oxygen entering the display area AA due to the peeling between the second signal line 320 and the packaging material SL.

According to an embodiment of the present disclosure, a distance between the sacrificial line 330 and the first signal line 310 may be configured to be smaller than a distance between the second signal line 320 and the first signal line 310. In the case where the sacrificial line 330 is closer to the first signal line 310 than the second signal line 320, it can help ensure that the sacrificial line 330 has priority over the second signal line 320 for electrochemical corrosion, thereby better protecting the second signal line 320.

In addition, in an embodiment of the present disclosure, the sacrificial line 320 and the second signal line 320 are located on the same side of the first signal line 310, and the distance between the sacrificial line 330 and the first signal line 310 may be configured to be smaller than the distance between the second signal line 320 and the first signal line 310. In other words, the sacrificial line can be disposed between the second signal line 320 and the first signal line 310, and thus helps to ensure that the sacrificial line 330 has priority over the second signal line 320 for electrochemical corrosion, thereby better protecting the second signal line 320.

In this disclosure, it should be understood that the positional relationship such as the distances between the first signal line 310, the second signal line 320, and the sacrificial line 330 described above may indicate that they are the positional relationship of the orthographic projection on a same plane (for example, a plane where a substrate disposing a display panel is located). In other words, the first signal line 310, the second signal line 320, and the sacrificial line 330 are not necessarily disposed on the same plane, and the positional relationship such as the distance between them can be defined by the positional relationship of their orthographic projection on the substrate.

In the embodiment shown in FIG. 3, the orthographic projections of the first signal line 310 and the second signal line 320 on the substrate do not overlap at all, but the present invention is not limited to this. The orthographic projections of the first signal line 310 and the second signal line 320 on the substrate may be at least partly not overlapped or, in other words, partly non-overlapping.

According to an embodiment of the present disclosure, as shown in FIG. 3, the sacrificial line 330 may be extended into the packaging material SL. In the case where the sacrificial line 330 is extended into the packaging material SL, it is possible to ensure that there is more corresponding area between the sacrificial line 330 and the first signal line 310, thereby providing more protection area for the second signal line 320.

In an embodiment, as shown in FIG. 3, the sacrificial line 330 may not be extended into the display area AA. In this case, it is possible to avoid the channel into the display area AA after the sacrificial line 330 being electrochemically eroded, thereby avoiding the problem of moisture and oxygen intrusion due to the sacrificial line 330 itself In an embodiment of the present disclosure, the sacrificial line 330 may be disposed on the same layer as the first signal line 310 and/or the second signal line 320. In other words, a same conductive metal layer may be used to form the sacrificial line 330 in the patterning process of forming the second signal line 320. Therefore, it is beneficial to reduce the number of process steps for patterning, thereby reducing costs and improving production efficiency.

With the display panel according to the present disclosure, since the sacrificial line can be provided with a level higher than that of the second signal line during the process of driving the OLED, the electrochemical corrosion effect of the second signal line can be weakened, thereby improving the ability to resist the intrusion of moisture and oxygen for the display panel with the OLED, thereby preventing the OLED device from being scrapped due to package failure during reliability testing and normal use.

Figure 4:
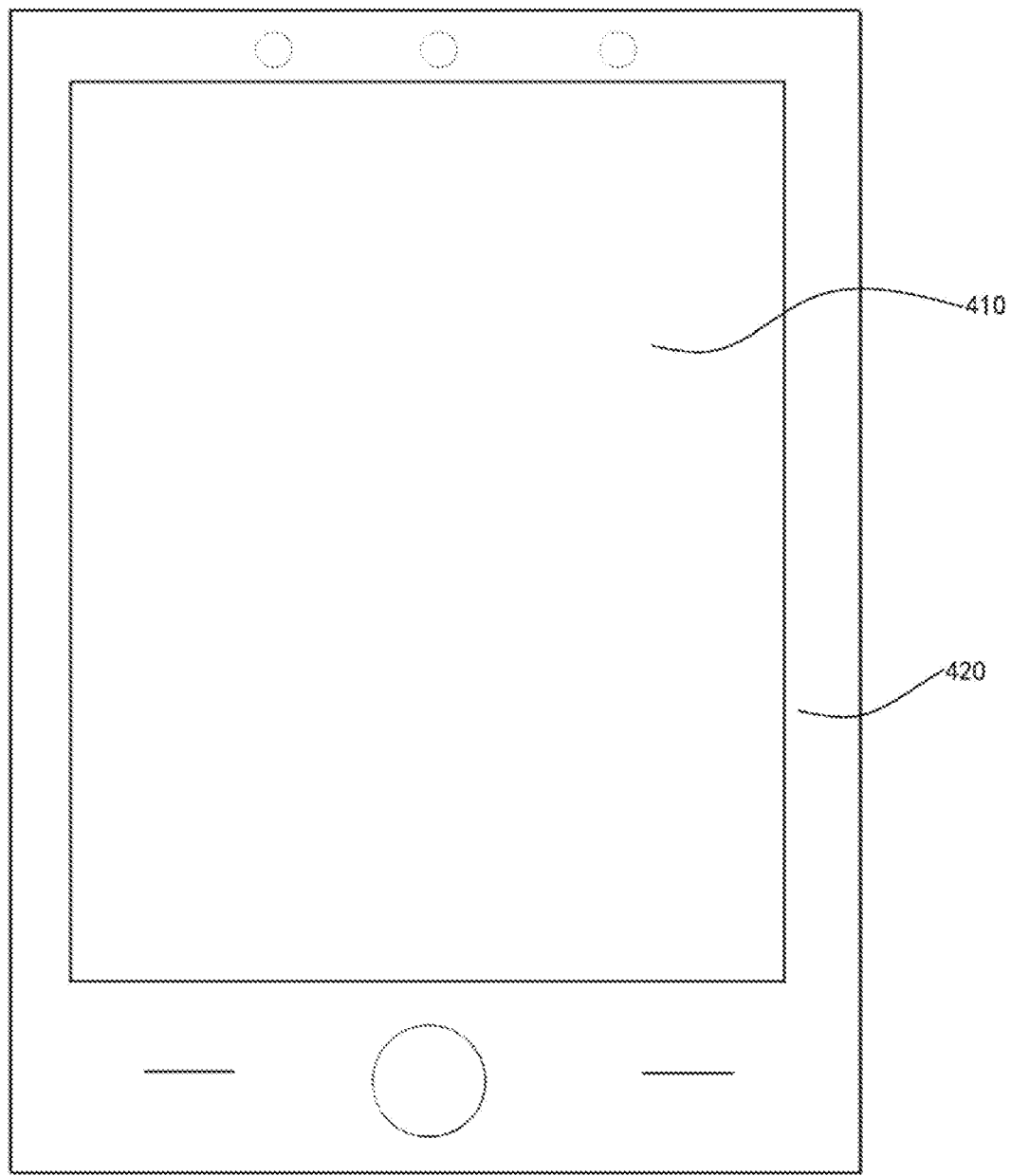
FIG. 4 is a schematic diagram of a display device according to an exemplary embodiment of the present disclosure.

FIG. 4 is a schematic diagram of a display device according to an exemplary embodiment of the present disclosure. Referring to FIG. 4, the display device 400 may include a display panel 410 and a frame 420. The display panel 410 may be a display panel according to any one of the foregoing embodiments, and the frame 420 may be configured to receive and fix the display panel 410 and corresponding peripheral devices (not shown), and provide corresponding protection to the display panel and peripheral devices.

In this embodiment, the display device 400 may include, for example, any product or component having a display function, such as a mobile phone, a tablet computer, a television, a notebook computer, a digital photo frame, a navigator, etc., and the present disclosure does not specifically limit this.

With the display device according to the present disclosure, since the sacrificial line can be provided with a level higher than that of the second signal line during the process of driving the OLED, the electrochemical corrosion effect of the second signal line can be weakened, thereby improving the ability to resist the intrusion of moisture and oxygen for the display panel with the OLED, and thereby preventing the OLED device from being scrapped due to package failure during reliability testing and normal use.

Figure 5:
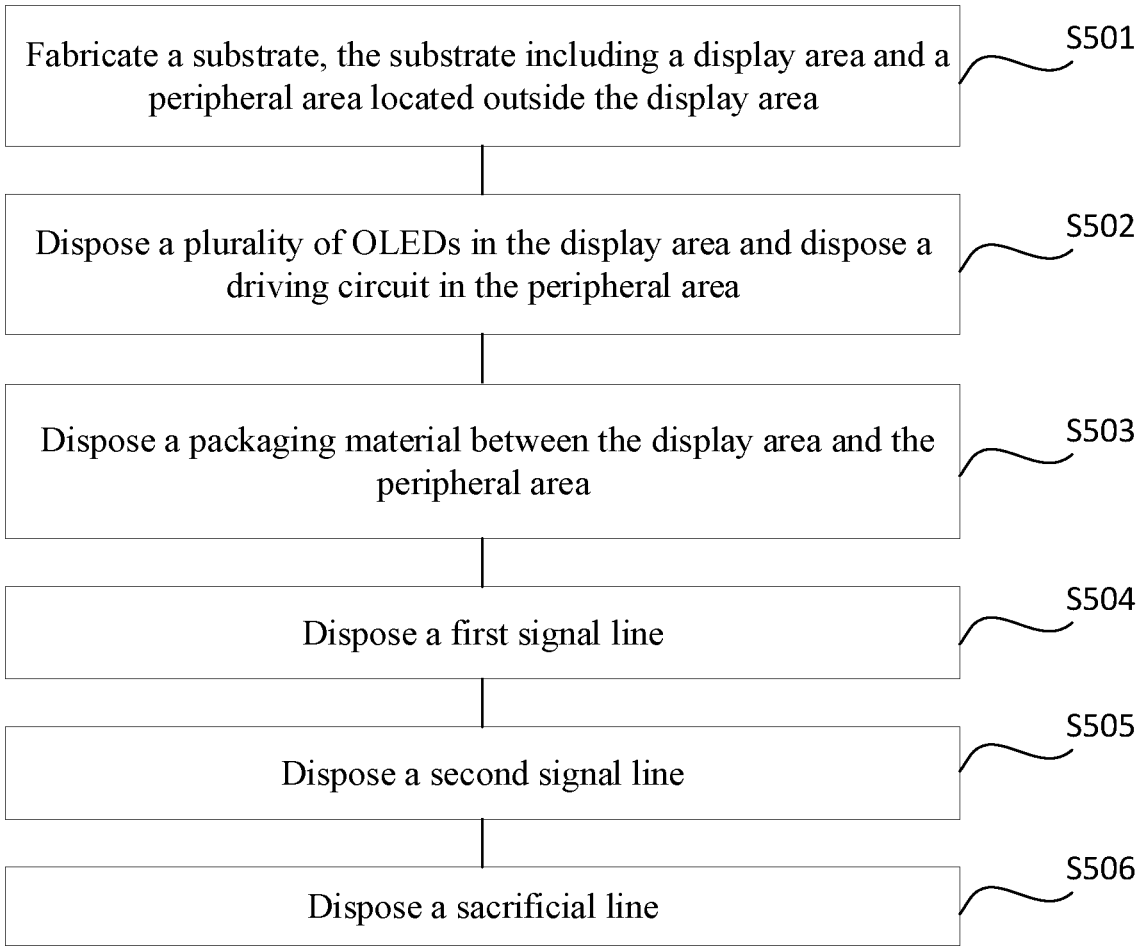
FIG. 5 is a flowchart of a fabrication method of a display panel according to an exemplary embodiment of the present disclosure.

FIG. 5 is a flowchart of a fabrication method of a display panel according to an exemplary embodiment of the present disclosure.

Referring to FIG. 5, the fabrication method for the display panel according to this embodiment includes the following steps: S501, fabricating a substrate, the substrate including a display area and a peripheral area located outside the display area; S502, disposing a plurality of OLEDs in the display area and disposing a driving circuit in the peripheral area; S503, disposing a packaging material between the display area and the peripheral area, the packaging material sealing the display area. In this embodiment, the method further includes: S504, disposing a first signal line, the first signal line passing through the packaging material to provide a first signal from the driving circuit to the plurality of OLEDs; S505, disposing a second signal line, the second signal line passing through the packaging material to provide a second signal from the driving circuit to the plurality of OLEDs; S506, disposing a sacrificial line, the sacrificial line being arranged to be connected adjacent to the first signal line and the second signal line, and the sacrificial line being connected to a voltage supply element.

It should be understood that although steps S501 to S506 are described in this embodiment, those skilled in the art should understand that there is no necessary sequence between the above steps, and one or more steps may be combined into one step, and/or a step can be split into one or more sub-steps.

In addition, it should also be understood that the details of the display panel described in the foregoing embodiment of the present disclosure can also be applied to the fabrication method according to the embodiment. For details, please refer to the foregoing description, which will not be repeated here.

With the method for fabricating a display panel according to the present disclosure, since the sacrificial line can be provided with a level higher than that of the second signal line during the process of driving the OLED, the electrochemical corrosion effect of the second signal line can be weakened, thereby improving the ability to resist the intrusion of moisture and oxygen for the display panel with the OLED, thereby preventing the OLED device from being scrapped due to package failure during reliability testing and normal use.

Figure 6:
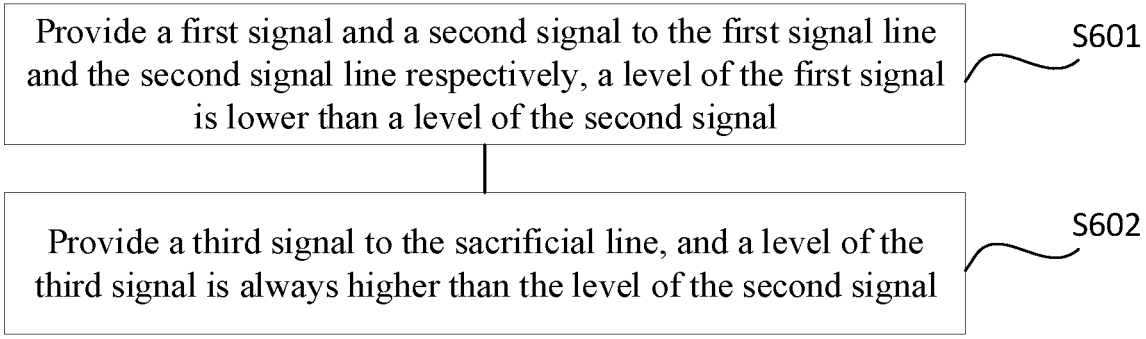
FIG. 6 is a flowchart of a driving method of a display panel according to an exemplary embodiment of the present disclosure.

FIG. 6 is a flowchart of a driving method of a display panel according to an exemplary embodiment of the present disclosure. Referring to FIG. 6, the driving method may be used to drive a display panel according to the foregoing embodiment of the present disclosure. The method includes the following steps: S601, providing a first signal and a second signal to a first signal line and a second signal line respectively through a driving circuit, a level of the first signal is lower than a level of the second signal; and S602, providing a third signal to a sacrificial line through a voltage supply element, and a level of the third signal is always higher than a level of the first signal and a level of the second signal.

With the driving method of the display panel according to the present disclosure, since the level of the sacrificial line can be provided to the sacrificial line higher than that of the second signal line during the process of driving the OLED, the electrochemical corrosion effect of the second signal line can be weakened, thereby improving the ability to resist the intrusion of moisture and oxygen for the display panel with the OLED, thereby preventing the OLED device from being scrapped due to package failure during reliability testing and normal use.

Those skilled in the art will readily contemplate other embodiments of the present disclosure after considering the specification and practicing the utility model disclosed herein. This application is intended to cover any variations, uses, or adaptations of this disclosure that conform to the general principles of this disclosure and include the common general knowledge or conventional technical means in the technical field not disclosed by this disclosure. It is intended that the specification and examples be considered as exemplary only, with a true scope and spirit of the disclosure being indicated by the following claims.

It should be understood that the present disclosure is not limited to the precise structure that has been described above and illustrated in the drawings, and various modifications and changes can be made without departing from the scope thereof. The scope of the disclosure is limited only by the following claims.

What is claimed is:

1. A display panel, comprising:
   a substrate comprising a display area and a non-display area located in a periphery of the display area;
   a plurality of organic light emitting diodes located in the display area;
   a driving circuit located in the non-display area, the driving circuit being configured to provide driving signals to the plurality of organic light emitting diodes;
   a first signal line configured to electrically connect the driving circuit and the plurality of organic light emitting diodes;
   a second signal line configured to electrically connect the driving circuit and the plurality of organic light emitting diodes, wherein an orthographic projection of the first signal line on the substrate and an orthographic projection of the second signal line on the substrate are at least partly not overlapped; and
   a sacrificial line disposed adjacent to the first signal line and the second signal line, wherein the sacrificial line is electrically connected to a voltage supply element,
   wherein, in response to driving the display panel, the first signal line and the second signal line are configured to be provided with a first signal and a second signal, respectively, through the driving circuit, a level of the first signal being lower than a level of the second signal; and wherein the sacrificial line is configured to be provided a third signal through the voltage supply element, a level of the third signal being always higher than the level of the first signal and the level of the second signal.

2. The display panel according to claim 1, wherein the voltage supply element is disposed in the driving circuit.

3. The display panel according to claim 1, wherein a distance between an orthographic projection of the sacrificial line on a plane where the substrate is located and the orthographic projection of the first signal line on the plane where the substrate is located is smaller than a distance between the orthographic projection of the second signal line on the plane where the substrate is located and the orthographic projection of the first signal line on the plane where the substrate of the display panel is located.

4. The display panel according to claim 3, wherein the sacrificial line and the second signal line are located on a same side of the first signal line.

5. The display panel according to claim 1, wherein the sacrificial line is disposed on a same layer as at least one of: the first signal line and the second signal line.

6. The display panel according to claim 1, further comprising a packaging material disposed between the display area and the non-display area.

7. The display panel according to claim 6, wherein the sacrificial line extends from the non-display area into the packaging material.

8. The display panel according to claim 7, wherein the sacrificial line does not extend into the display area.

9. The display panel according to claim 1, wherein the sacrificial line is disposed in a slotted region of the display panel.

10. A display device, comprising:
a display panel, comprising:
a substrate comprising a display area and a non-display area located in a periphery of the display area;
a plurality of organic light emitting diodes located in the display area;
a driving circuit located in the non-display area, the driving circuit being configured to provide driving signals to the plurality of organic light emitting diodes;
a first signal line configured to electrically connect the driving circuit and the plurality of organic light emitting diodes;
a second signal line configured to electrically connect the driving circuit and the plurality of organic light emitting diodes, wherein an orthographic projection of the first signal line on the substrate and an orthographic projection of the second signal line on the substrate are at least partly not overlapped; and
a sacrificial line disposed adjacent to the first signal line and the second signal line, wherein the sacrificial line is electrically connected to a voltage supply element,
wherein, in response to driving the display panel, the first signal line and the second signal line are configured to be provided with a first signal and a second signal, respectively, through the driving circuit, a level of the first signal being lower than a level of the second signal; and
wherein the sacrificial line is configured to be provided a third signal through the voltage supply element, a level of the third signal being always higher than the level of the first signal and the level of the second signal; and
a frame.

11. The display device according to claim 10, wherein the voltage supply element is disposed in the driving circuit.

12. The display device according to claim 10, wherein a distance between an orthographic projection of the sacrificial line on a plane where the substrate is located and the orthographic projection of the first signal line on the plane where the substrate is located is smaller than a distance between the orthographic projection of the second signal line on the plane where the substrate is located and the orthographic projection of the first signal line on the plane where the substrate of the display panel is located.

13. The display device according to claim 12, wherein the sacrificial line and the second signal line are located on a same side of the first signal line.

14. The display device according to claim 10, further comprising a packaging material disposed between the display area and the non-display area.

15. The display device according to claim 14, wherein the sacrificial line extends from the non-display area into the packaging material.

16. The display panel according to claim 15, wherein the sacrificial line does not extend into the display area.

17. The display device according to claim 10, wherein the sacrificial line is disposed on a same layer as at least one of: the first signal line and the second signal line.

18. A method for driving a display panel, comprising:
providing the display panel, wherein the display panel comprises:
a substrate comprising a display area and a non-display area located in a periphery of the display area;
a plurality of organic light emitting diodes located in the display area;
a driving circuit located in the non-display area, the driving circuit being configured to provide driving signals to the plurality of organic light emitting diodes;
a first signal line configured to electrically connect the driving circuit and the plurality of organic light emitting diodes;
a second signal line configured to electrically connect the driving circuit and the plurality of organic light emitting diodes, wherein an orthographic projection of the first signal line on the substrate and an orthographic projection of the second signal line on the substrate are at least partly not overlapped; and
a sacrificial line disposed adjacent to the first signal line and the second signal line, wherein the sacrificial line is electrically connected to a voltage supply element
providing a first signal and a second signal to the first signal line and the second signal line, respectively, through the driving circuit, a level of the first signal being lower than a level of the second signal; and
providing a third signal to the sacrificial line through the voltage supply element, a level of the third signal being always higher than the level of the first signal and the level of the second signal.

19. The method according to claim 18, wherein the voltage supply element is disposed in the driving circuit.

20. The method according to claim 18, wherein a distance between an orthographic projection of the sacrificial line on a plane where the substrate is located and the orthographic projection of the first signal line on the plane where the substrate is located is smaller than a distance between the orthographic projection of the second signal line on the plane where the substrate is located and the orthographic projection of the first signal line on the plane where the substrate of the display panel is located.

* * * * *